(12) United States Patent
Paul

(10) Patent No.: US 7,446,691 B2
(45) Date of Patent: Nov. 4, 2008

(54) METHODS AND APPARATUS FOR MULTIPLEXED SIGNAL SOURCES USING AN ANALOG-TO-DIGITAL CONVERTER

(75) Inventor: Christopher Paul, Bayport, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 11/693,083

(22) Filed: Mar. 29, 2007

(65) Prior Publication Data

US 2008/0238745 A1 Oct. 2, 2008

(51) Int. Cl.
*H03M 1/12* (2006.01)
(52) U.S. Cl. .......................... 341/155; 341/154; 341/29; 341/131; 455/573.3
(58) Field of Classification Search .................. 341/127, 341/155, 154, 131, 29; 455/575.3
See application file for complete search history.

(56) References Cited

U.S. PATENT DOCUMENTS 5,289,191 A * 2/1994 Elms ........................... 341/127
6,057,795 A * 5/2000 Suzuki ......................... 341/155
6,434,404 B1 * 8/2002 Claxton et al. ............ 455/575.3

* cited by examiner

*Primary Examiner*—Jean B Jeanglaude
(74) *Attorney, Agent, or Firm*—Ingrassia, Fisher & Lorenz, P.C.

(57) ABSTRACT

A multiplexing circuit uses parallel-configured pairs of resistors and signal sources in a voltage divider network in such a way that a single analog-to-digital input can be used to specify the state of more than one signal source. One circuit includes a microprocessor having an analog-to-digital (ADC) input; a memory communicatively coupled to the microprocessor; and a voltage divider network having an output coupled to the ADC input, wherein the network includes a plurality of resistors paired with a plurality of respective signal sources, and wherein the output is unique for each combination of states of the signal sources in accordance with a known relation that is stored in the memory. The signal sources are selected from two categories of sources: continuous sources and discrete sources, where discrete sources may be binary discrete or random discrete. In one embodiment, the first signal source is either a continuous source or a random discrete source, and the second signal is a binary discrete source.

14 Claims, 8 Drawing Sheets

METHODS AND APPARATUS FOR MULTIPLEXED SIGNAL SOURCES USING AN ANALOG-TO-DIGITAL CONVERTER

TECHNICAL FIELD

The present invention generally relates to analog-to-digital converter circuitry and, more particularly, to systems for utilizing a single analog-to-digital converter input to represent a plurality of signal sources.

BACKGROUND

It is often necessary to monitor the state of various signals related to operation of a device. These signal sources typically include digital sources (switches, buttons, triggers, and the like), as well as discrete or continuous voltage levels (battery levels, etc.). Traditionally, each such signal source is connected to an independent input of a processor so that the processor can react when any one or several of the inputs are activated or reach a predetermined level or levels. In a mobile barcode scanning terminal, for example, the power button, the scan trigger, the battery door, and many other components are often monitored continuously. Similarly, such devices may include various photodetectors, microphones, status indicators, and other discrete and continuous signal sources. As the number of signal sources increases, the number of required general purpose input/output (GPIO) pins on the processor also increases.

In many cases, the only way to increase the number of GPIO pins is to include a larger, more expensive microprocessor, causing the product to increase in size and cost. This is most notably a problem in mobile devices, where miniaturization is key, and there is therefore always a need to reduce the amount of board-space taken up by components.

R2R ladder networks, which are well-known in the art for their use in successive-approximation registers, allow the position of a series of switches to be converted to an analog output voltage. These circuits are central to traditional digital-to-analog techniques. Such R2R ladder networks are undesirable, however, in that they require a great many resistors and use single-pole/double-thow switches, which tend to be expensive, large, and complex. Furthermore, such systems are not capable of handling multi-voltage signal sources (i.e., discrete or continuous sources).

Accordingly, there is a need for systems and methods that allow the state of multiple switches and other binary digital inputs to be monitored without increasing the number and/or size of processors used in the system.

BRIEF SUMMARY

A multiplexing circuit in accordance with the present invention uses parallel-configured pairs of resistors and signal sources in a voltage divider network in such a way that a single analog-to-digital input can be used to specify the state of more than one signal source—e.g., a signal source used in connection with a mobile device, such as a barcode scanner. One such circuit includes a microprocessor having an analog-to-digital (ADC) input; a memory communicatively coupled to the microprocessor; and a voltage divider network having an output coupled to the ADC input, wherein the network includes a plurality of resistors paired with a plurality of respective signal sources, and wherein the output is unique for each combination of states of the signal sources in accordance with a known relation that is stored in the memory. The signal sources might produce one or more discrete voltage values, or may produce a continuous range of voltage values. Signal sources are selected from two categories of sources: continuous sources and discrete sources, where discrete sources may be binary discrete or random discrete. Sources are selected from these categories such that the output is unique for each combination of states.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
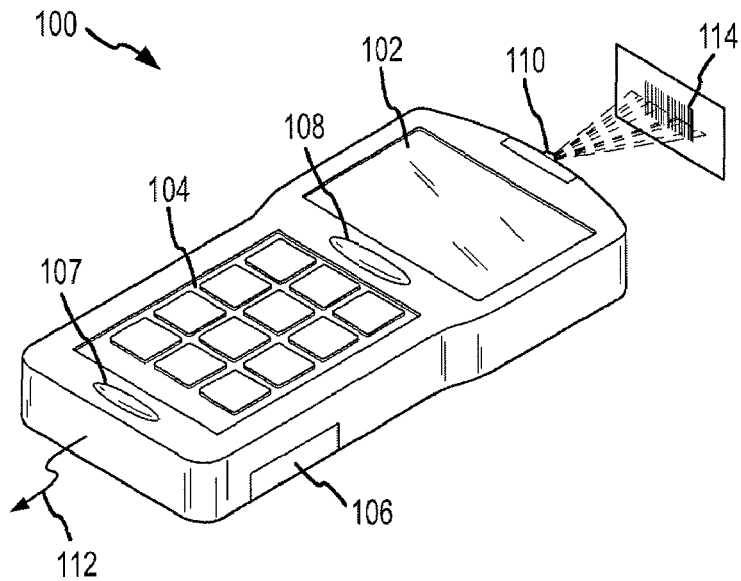
FIG. 1 is an overview of a terminal device useful in illustrating operation of the present invention.

The present invention generally describes a multiplexing circuit that includes parallel-configured pairs of resistors and signal sources in a voltage divider network, wherein the operative components are selected such that a single analog-to-digital input can be used to specify the state of more than one signal source. The signal sources are selected from two categories of sources: continuous sources and discrete sources, where discrete sources may be binary discrete or random discrete, as described in further detail below.

The following detailed description is merely exemplary in nature and is not intended to limit the range of possible embodiments and applications. Furthermore, there is no intention to be bound by any theory presented in the preceding background or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawing figures are not necessarily drawn to scale: the dimensions of some features may be exaggerated relative to other elements to improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein. Unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

The terms "comprise," "include," "have" and any variations thereof are used synonymously to denote non-exclusive inclusion. The terms "left," "right," "in," "out," "front," "back," "up," "down," and other such directional terms are used to describe relative positions, not necessarily absolute positions in space. The term "exemplary" is used in the sense of "example," rather than "ideal."

Although the present invention may be used in conjunction with any type of device, FIG. 1 depicts a particular example useful in illustrating operation of a multiplexer in accordance with the present invention. In general, a mobile scanning terminal 100 includes an input device (e.g., keyboard or keypad) 104, a power switch 107, a battery door 106, a scan trigger 108, a scanner 110, and a display 102. Scanner 110 comprises any suitable scanning or imaging device capable of reading printed indicia (e.g., a barcode) 114 and creating an electronic representation of that image, which is then processed by terminal 100. Such scanners might include, for example, charge coupled device (CCD) image sensors, laser scanners, lenses, and other optical components. Terminal 100 typically includes various microprocessors, memory, digital-signal-processors (DSPs) and input/output components (not shown in FIG. 1). Terminal 100 might also include a communication link 112 (e.g., a wireless network connection) to allow it to communicate with a host, server, or stand-alone computer. Scanner 110 might also include various photodetectors, microphones, and the like.

Figure 2:
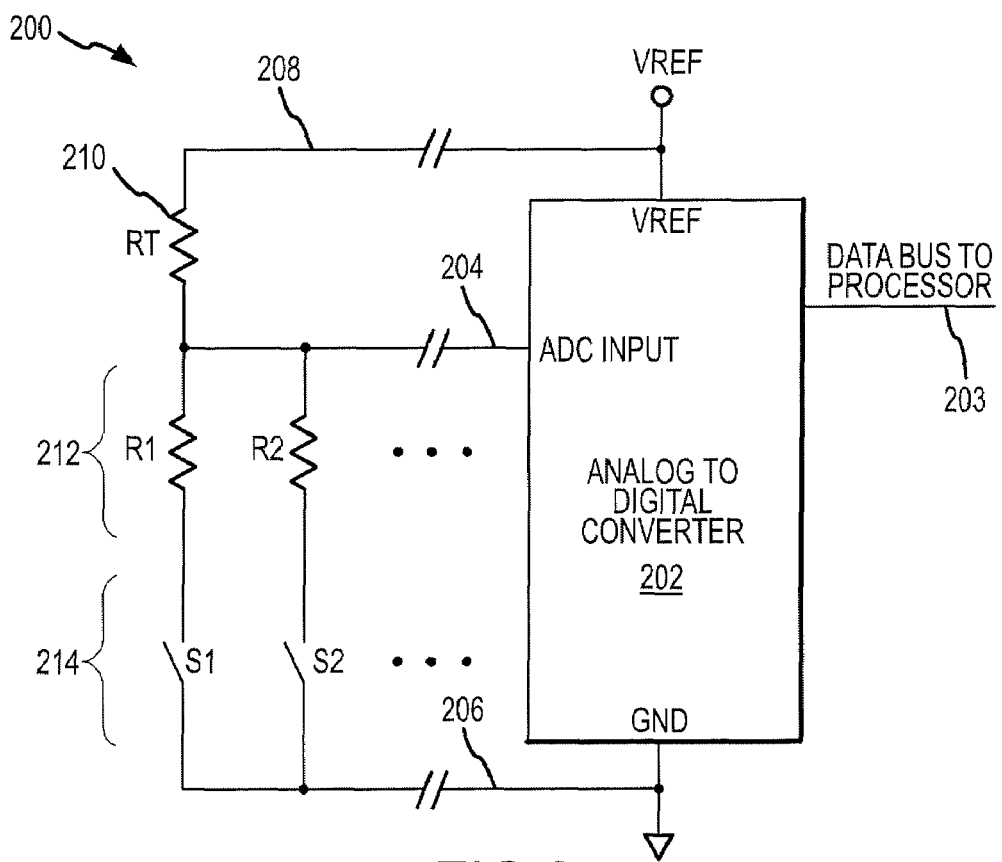
FIG. 2 is a circuit diagram in accordance with one embodiment of the present invention.

As described above, prior art systems typically include separate digital inputs to a processor located within terminal 100 in order to monitor the state of battery door 106, scan trigger 108, power switch 107, and other voltage values within the device. Referring to FIG. 2, however, a multiplexer circuit 200 in accordance with one embodiment of the present invention allows a single analog-to-digital input to be used to specify the state of multiple inputs. In this regard, while FIG. 2 depicts the case where the signal sources are simply switches coupled to a reference voltage, the present invention is not so limited, as will be described in further detail below.

Referring to the embodiment depicted in FIG. 2, which corresponds to the case where the signal sources comprise switches coupled to a reference voltage, the multiplexer circuit generally includes an analog-to-digital converter (ADC) 202, a plurality of resistors 212 (R1, R2, . . . , Rn) coupled to respective switches 214 (S1, S2, . . . Sn), and a resistor 210—all of which are configured as a voltage-divider network with respect to VREF 208 and GND 206. ADC 202 has an ADC input 204, a data output 203, a ground (GND) terminal 206, and a reference voltage terminal (VREF) 208.

Each set of resistors 212 and switches 214, which themselves are connected in series, are connected in parallel between ADC input 204 and GND 206. Resistor RT is connected between VREF 208 and ADC input 204. A variety of resistor types may be used for resistors 212 and 210; for example, standard axial resistors (e.g., carbon or metal-film resistors) single-in-line (SIL) resistor networks, surface-mount resistors, thin-film resistors, or the like.

Each switch 214 is coupled to and/or represents some binary state of the application in which it is placed. For example, with respect to the terminal example shown in FIG. 1, a switch S1 might correspond to the state of battery door 106 (open/closed), while switch S2 might correspond to the state of power button 108 (pressed/released). Indeed, switches 214 may correspond to any respective set of digital inputs.

When a particular switch is "on," the corresponding resistor becomes part of the voltage divider circuit; but when it is "off," the corresponding resistor is inactive. Thus, by selecting values of RT, R1, R2, . . . Rn, the analog ADC input 204 is unique for any given combination of "on" and "off" switches.

More particularly, consistent with voltage-division circuitry, the voltage at ADC input 204 is equal to a fraction of VREF, where that fraction is determined by the ratio of resistor 210 to the contribution of resistors 212 as activated by switches 214. This contribution is equal to the equivalent resistance Req of the parallel sum of all activated resistors 212. Thus, if S1 and S2 are both "on" (closed), then both R1 and R2 are activated, and the effective resistance of activated resistors 212 is given by 1/Req=(1/R1+1/R2). The voltage at ADC input 204 is then VREF(Req/(RT+Req)).

Given a particular ADC input voltage, then, ADC 202 produces a corresponding digital representation of that voltage (e.g., an eight-bit, twelve-bit, or other length word) using conventional analog-to-digital techniques. In the illustrated embodiment, the digital output 203 is provided on a data bus to a microprocessor; however, digital output 203 may be of any convenient form (e.g., parallel bits, serial data, etc.) The digital output 203 can then be decoded by subsequent processing (e.g., by a microprocessor) based on an a priori knowledge of this relation—e.g., a look-up table or equation specifying the relationship between ADC input 204 and state of switches 214.

More particularly, when the values of the various resistors 212 and 210 are specified, a suitable memory component is used to store a relation that uniquely maps the state of the plurality of switches to respective voltage values. During operation, the ADC 202 reads the analog voltage value 204 produced by the voltage divider network coupled to the plurality of switches, then converts the analog voltage value to a digital voltage representation. The microprocessor then uses digital voltage representation and the stored relation to determine the state of the plurality of switches.

Figure 3:
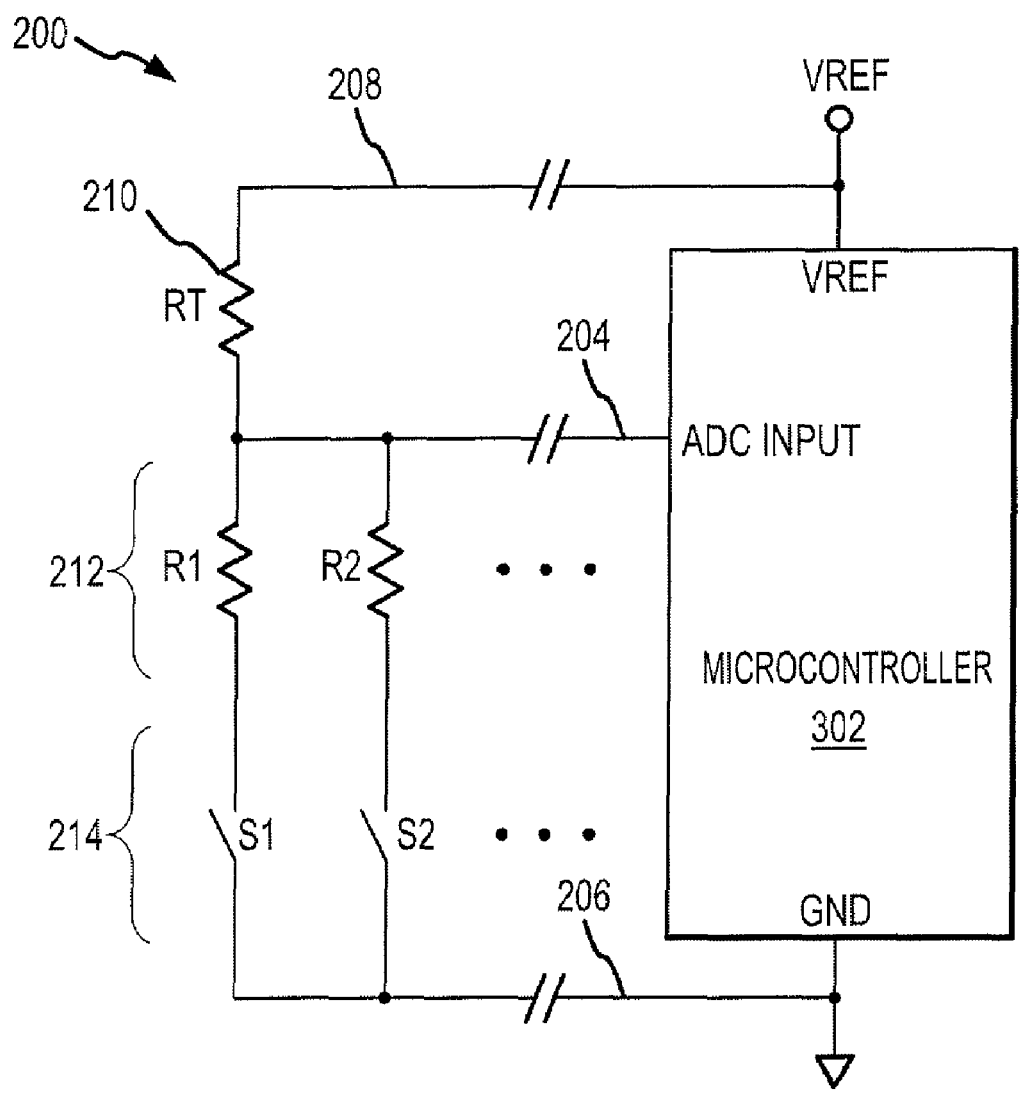
FIG. 3 is a circuit diagram in accordance with another embodiment of the present invention.

In an alternate embodiment, shown in FIG. 3, ADC 202 is replaced by a microcontroller 302 that has an ADC input 204, and which has an internal ADC (not shown in FIG. 3). That is, many microcontrollers include an internal ADC. The present invention contemplates that the multiplexer circuitry described herein may be used in conjunction with any device, circuit, or component that accepts an analog input to an ADC.

Figure 4A:
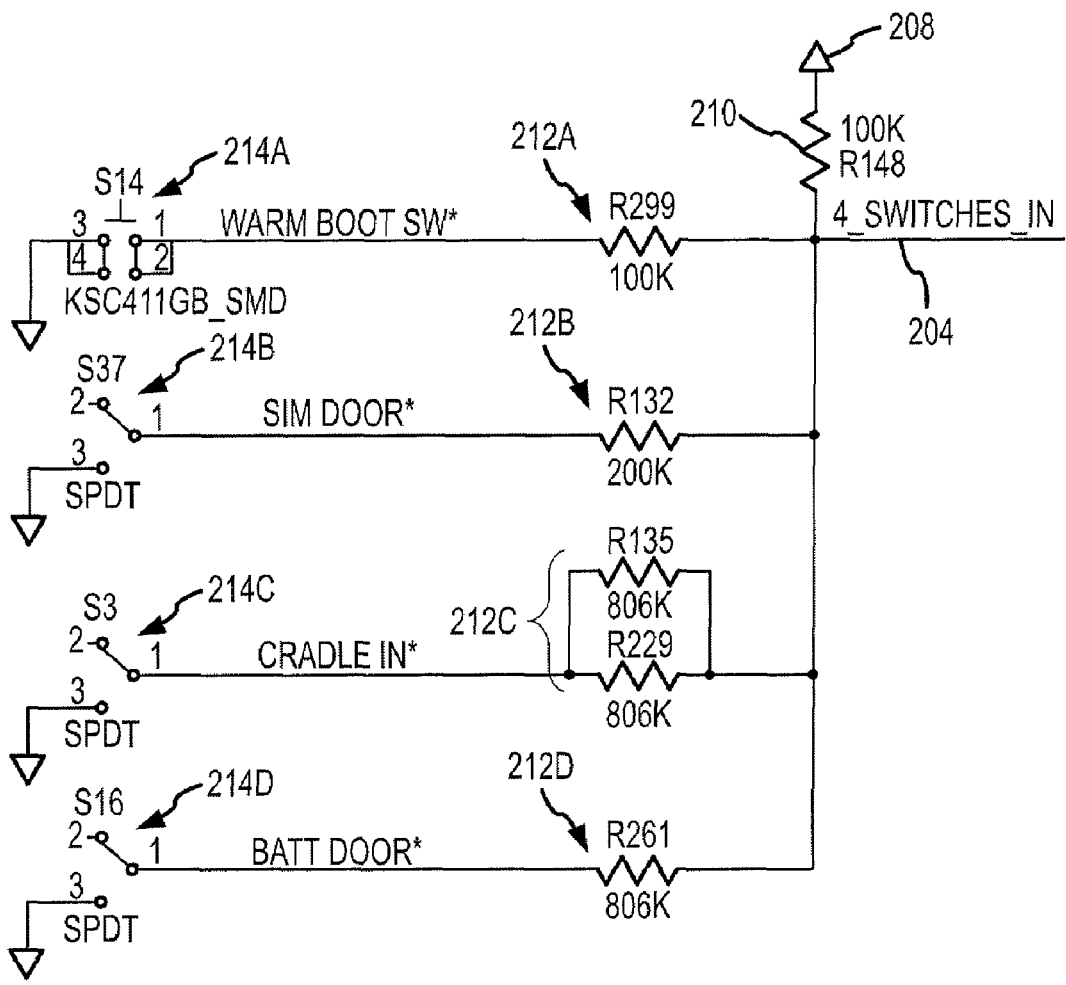
FIGS. 4A and 4B are circuit diagrams in accordance with a specific embodiment of the present invention.

In accordance with a specific mobile terminal embodiment, shown in FIG. 4A, the circuit is configured with four resistors 212(*a*)-(*d*) and corresponding switches 214(*a*)-(*d*) having respective values of 100K, 200K, 403K (two parallel 806K resistors in parallel, in this embodiment), and 806K. Resistor 210 has a value of 100K. Line 204 is used as the input to an ADC (not shown). In this application, switch 214(*d*) corresponds to the battery door, and indicates whether the battery is about to be removed. Switch 214(*c*) indicates whether the terminal is in or out of a cradle. Switch 214(*b*) indicates whether a card (e.g., a subscriber identification module (SIM) card) is being removed or inserted into the terminal, and switch 214(*a*) initiates a "warm boot" of the system.

The tolerance of the resistors (i.e., the maximum error in resistance value) controls, to a large extent, the resolution of possible analog values that can be generated for ADC input 204. That is, the better (i.e., lower) the tolerance value, the more resistors and switches that can be incorporated into the voltage divider network while ensuring that a unique voltage is presented at ADC input 204 for each combination of switch states. Accordingly, in one embodiment of the present invention, resistors 212 are of the type having a 1% tolerance, and four resistors and switches are used (n=4). In another embodiment, resistors 212 have a 0.5% tolerance, and five resistors and switches are used (n=5). Similarly, the higher the resolution and/or accuracy of the ADC, the greater number of signal sources may be multiplexed.

As mentioned above, the values of resistors R1-Rn are selected such that the value of ADC input 204 is unique for every combination of activated and non-activated resistors. In the case where n=2, for example, the resistors (R1 and R2) should be selected such that ADC input 204 has four unique analog values. In general, resistors R1, R2, . . . , Rn should be selected such that ADC input 204 has $2^n$ unique analog values. Because each value is unique, subsequent processing can determine the state of switches S1, S2, . . . , Sn as long as the relationship between the switches and analog input 204 is known. In one embodiment, this relation is stored in a volatile or non-volatile memory device associated with the device.

Figure 5:
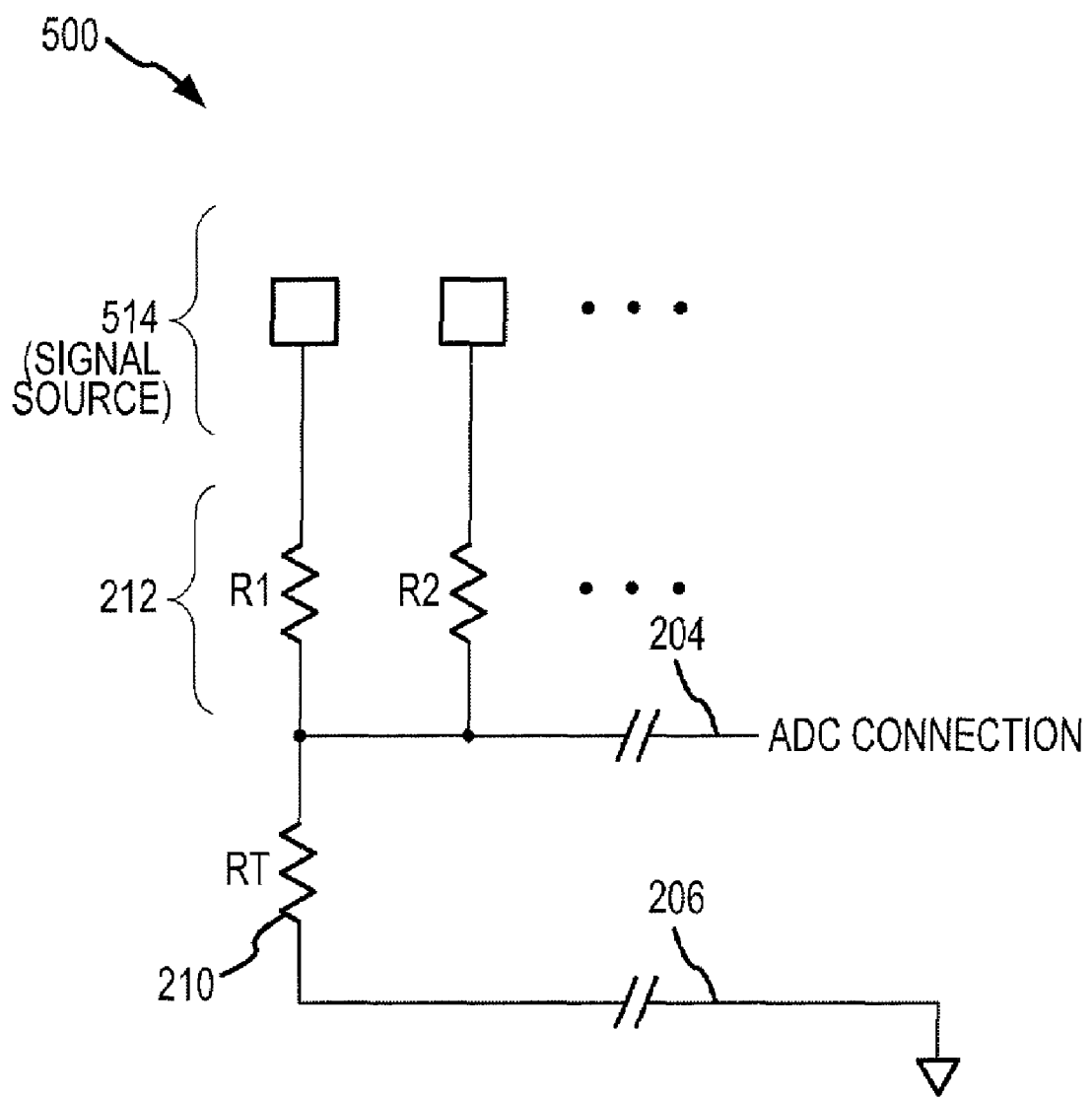
FIG. 5 is a generalized circuit diagram in accordance with another embodiment of the present invention.

FIG. 5 depicts another, more generalized, embodiment, wherein a set of signal sources 514 and respective resistors 212 are coupled in series to ADC connection 204, and a resistor 210 (RT) is coupled from ADC connection 204 to ground node 206. As with the previous embodiments, the values of resistors 212 may be selected in accordance with the number and expected values of signal sources 514, as well as other design features (e.g., the tolerance values of the resistors being used).

More particularly, each signal source 514 produces a voltage signal, which may be discrete or continuous. In the case of a discrete voltage source, the source might produce a single arbitrary voltage value, or might produce multiple discrete values. In the case of a continuous voltage source, a range of voltage values that vary over a continuum may be produced. It will be appreciated that any number of signal sources 514 may be present in any particular circuit, and that multiple types of signal sources may be used, subject to certain practical constraints.

The system (e.g., a memory within microcontroller 302 of FIG. 3) is used to store information that will allow the voltage values of the respective signal sources 514 to be determined uniquely from the state of the ADC output. Thus, the system will know, a priori, the number of signal sources 514 as well as the range of values that such signal sources 514 might have. In one embodiment, for example, a look-up table is created and stored, and for each value of the ADC in the look-up table, a corresponding list of signal source states (i.e., voltage values) is specified. It will be appreciated by those skilled in the art that the values of any resistors in the circuit may be selected, based on the nature of signal sources 514, to achieve substantially unique values within the look-up table.

More particularly, signal sources 514 are selected from two categories of sources: continuous sources and discrete sources, where discrete sources may be binary discrete or random discrete, as described in further detail below. The sources are selected from these categories such that the output is unique for each combination of states.

"Continuous sources," as that term is used herein, refers to sources that are characterized by a continuous range of voltage values (e.g., microphones, photodetectors, and the like). Such sources would theoretically require an infinite number of bits for representation, but in practice they are scaled to a set of n bits.

In contrast, "discrete sources," as that term is used herein, refers to binary discrete sources and random discrete sources. Binary discrete sources are those sources that can be represented exactly by m contiguous bits in the range of values from $2^{(1+n-m)}$ to $2^n$. Such sources include DACs, R-2R ladder networks, and systems which are conditioned by circuits such as op-amp-based summers whose outputs differ by linear combinations of powers of two. "Random discrete sources," as used herein, refers to all discrete sources that do not fit within the category of "binary discrete." Such sources produce "voids" (unrepresented values) within binary space and may occupy values requiring an infinite series of powers of 2 to represent exactly.

As mentioned briefly above, certain practical considerations inform the selection of sources 514 from the various categories of sources. In one embodiment, for example, the number of continuous sources is limited to one or less. It will be appreciated that the sum of multiple continuous sources would result in non-unique mapping of source values to the output of any summing network. For instance, if one source produces values within a continuous range of 1 to 4, and another within the range of 5 to 8, it is clear that the different cases of 2+7 and 3+6 would yield indistinguishable results. In the event a continuous source is used, it preferably employs only the least significant bits (LSBs) of the ADC for characterization, leaving the higher bits to be associated with other sources. This is again a consequence of the desire to ensure that a given output voltage was generated by a unique set of input voltages. If the continuous source generated values in the range of 0 to 3 and a discrete source the values 4 and 5, again, 1+5 would be indistinguishable from 2+4.

In accordance with another aspect of the invention, the number of random discrete sources is generally limited to one or less, and again only the LSBs are used for characterization. The reason for this is that, like continuous sources, any particular sum of multiple distinct random sources may have been generated by more than one distinct set of output values from each source. That is, the sum may not be unique. Accordingly, it is preferred that sources 514 not include both a random discrete source and a continuous source (as both would require use of the LSBs). The number of binary discrete sources is not so limited, and may be selected in accordance with the number of available bits as long as (ideally) the source is scaled so that each of the source's output levels is associated with a distinct ADC conversion value.

In accordance with one aspect of the present invention, non-linear sources may be linearized. In this regard, a network of linear sources consists of sources such that the sums of the two sources are expressible as $a_1 S_1 + a_2 S_2$, where $a_1$ and $a_2$ are constants, and $S_1$ and $S_2$ are the respective source outputs. Stated another way, in accordance with the principle of superposition, the contribution of any signal source to the output signal should be independent of the value of any of the other sources. One example of a network containing a non-linear source is a simple non-linear SPST switch ($S_1$) and a linear voltage source ($S_2$) connected together by two equal-valued resistors. If both sources $S_1$ and $S_2$ are ground-referenced, and the SPST switch is open, the output at the resistor junction is equal to $S_2$. If $S_1$ is closed, however, the output is $S_2/2$. There is no constant coefficient $a_2$ that can be used to multiply $S_2$ for both states of $S_1$. Thus S1 is non-linear, as is the network of the two sources. Non linear networks complicate the job of determining the value of the sources that made up a particular ADC conversation, and also tend to use that conversion space inefficiently. It is therefore desirable, when possible, to deal with linear networks.

Figure 4B:
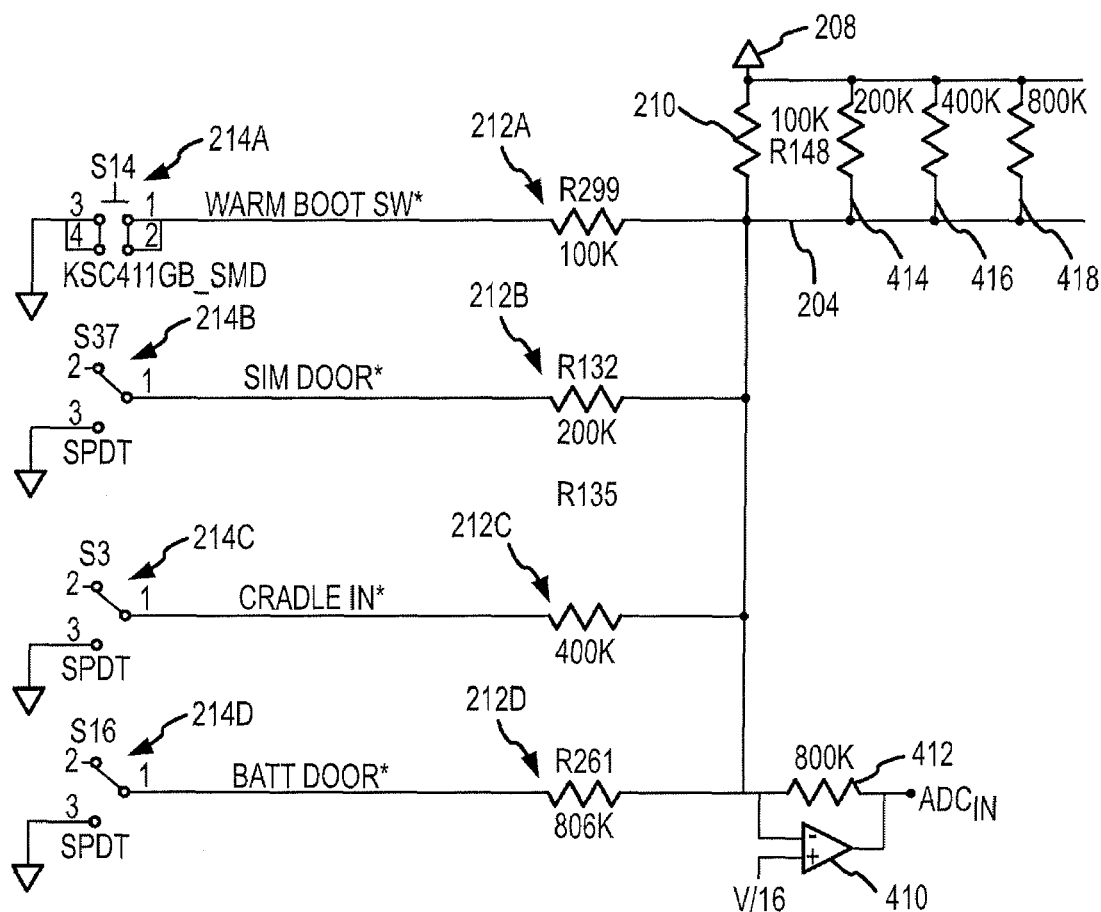

One way to linearize this and other such networks is to employ a summing op-amp whose positive input is biased to a non-zero voltage Vref. For example, consider an array of M SPST ground referenced switches $S_1, S_2 \ldots S_M$ as non-linear signal sources. If each switch is connected to a resistor $R_m$ (where $R_m$ is a uniquely valued resistor and m is the index of the switch), the other ends of $R_m$ are connected to the negative op-amp input, and a feedback resistor having a value Rf is connected from the op-amp output to its negative input, then the result is a linearized array of sources. Regardless of whether any of the switches is open or closed, the output signal is equal to the sum from m=1 to M of Vref $(1+S_m R_f/R_m)$, where $S_m$ is equal to 1 when closed and 0 when open. Thus, each source has a constant multiplier, and the resulting system is linear. FIG. 4B, for example, shows the circuit of FIG. 4B modified by including an inverting summer 410 with a feedback resistor 412, wherein the negative input is connected to resistors 212, and the positive input is connected to a non-zero voltage. As mentioned above, regardless of the state of any of the switches 214A-214D, each source has a constant multiplier. As an added benefit, if the resistors $R_m$ are selected to equal $2^m R$ (where R is an arbitrary value), then the result is not only linear discrete but is also linear binary discrete, because the value of each source at the op amp output is multiplied by a different power of 2. This has a real advantage in efficiency in that ADC conversion values are a sum of powers of 2 and each ADC conversion value can be exactly mapped to a different combination of source values. No A to D conversion value within a sequence is skipped, and no combination of sources yields a value other than an A to D conversion value, minimizing the likelihood of the A to D converter making the wrong decision regarding the combination of sources.

Figure 6:
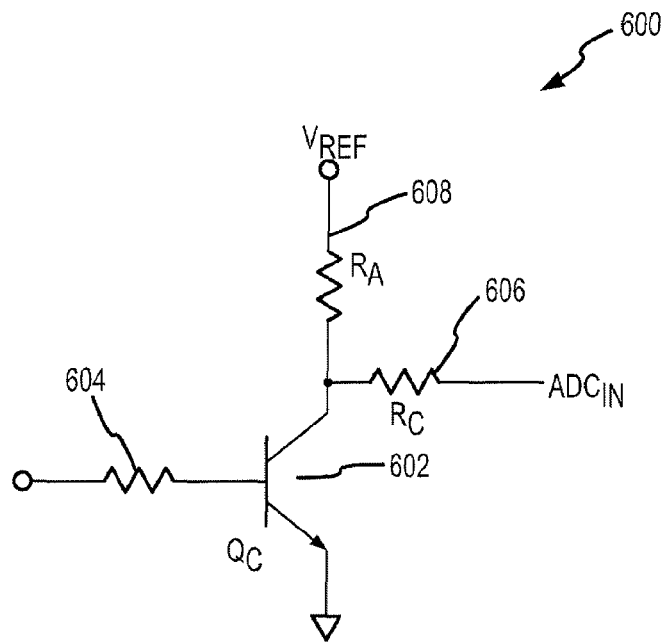
FIGS. 6 and 7 depict various sources used in conjunction with the present invention.
Figure 7:
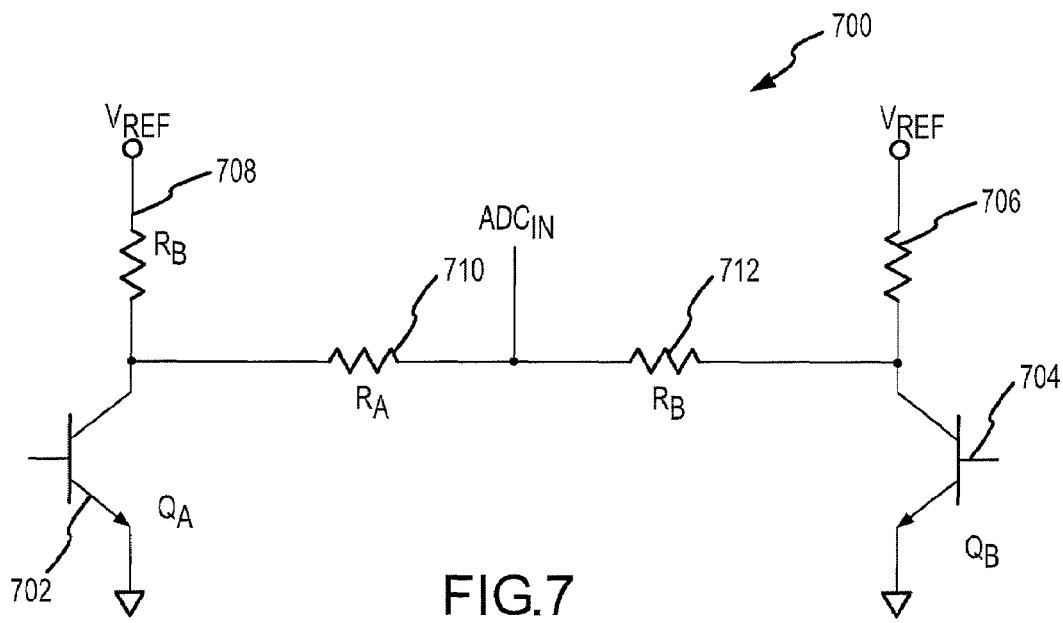
Figure 8:
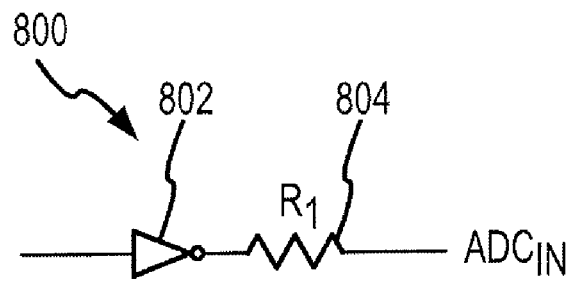
FIGS. 8 and 9 show additional sources used in conjunction with the present invention.
Figure 9:
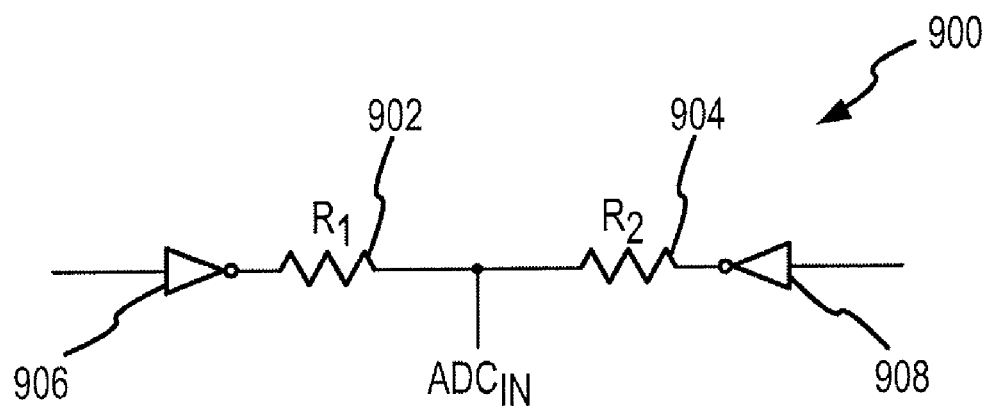

FIG. 6 shows a bi-valued discrete random source 600, and FIG. 7 shows a comparable quad-valued discrete random source 700. Consider the case in which all transistors are operated as switches (in cutoff or saturation). In accordance with the criteria above, both of these sources are non-linear in that they cannot be added to another source such that they fulfill the principle of superposition. This is because the circuit's differently load and therefore attenuate the signals from any other sources to which they are connected, depending on the states of the transistors. FIGS. 8 and 9 show alternate source circuits in which the transistors and corresponding resistors of FIGS. 6 and 7 are replaced with three totem pole output logic inverters (802, 906, and 908) and output resistances (804, 902, and 904). This yields drivers with very low, nearly identical output resistances regardless of whether their outputs are high or low. The sources are thus linear.

Figure 10:
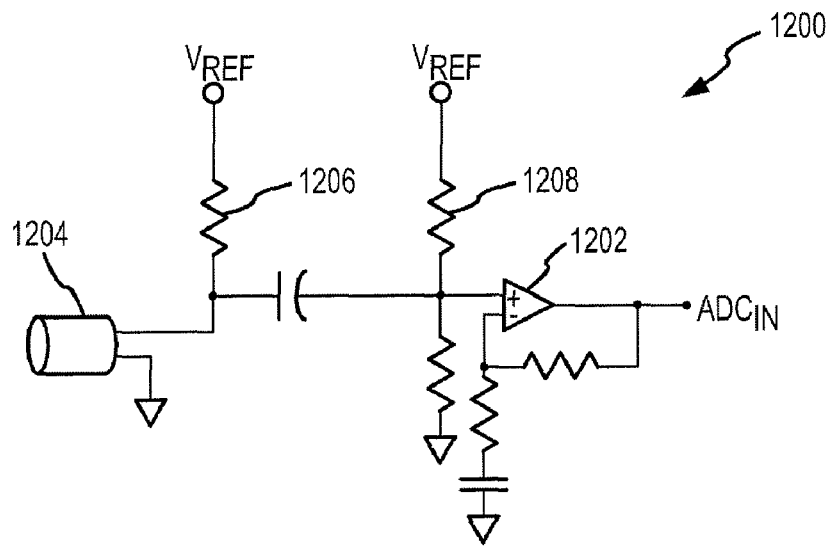
FIG. 10 shows an exemplary continuous source used in conjunction with the present invention.

FIG. 10 depicts an example continuous source—i.e., a microphone circuit with gain. As shown, a microphone 1204 is coupled to a supply voltage (Vref), an operational amplifier 1202, and resistors 1206 and 1208 along with various passive components configured in a conventional manner. The output of operational amplifier 1202 is a continuously variable voltage that is responsive to sound pressure sensed by microphone 1203.

Figure 11:
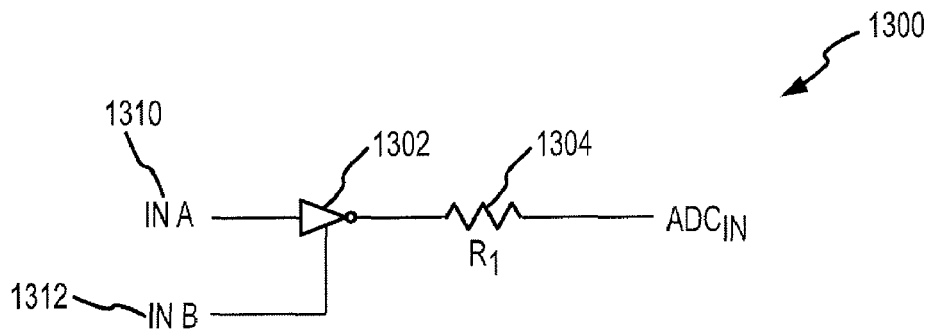
FIGS. 11 and 12 show additional sources used in conjunction with the present invention.
Figure 12:
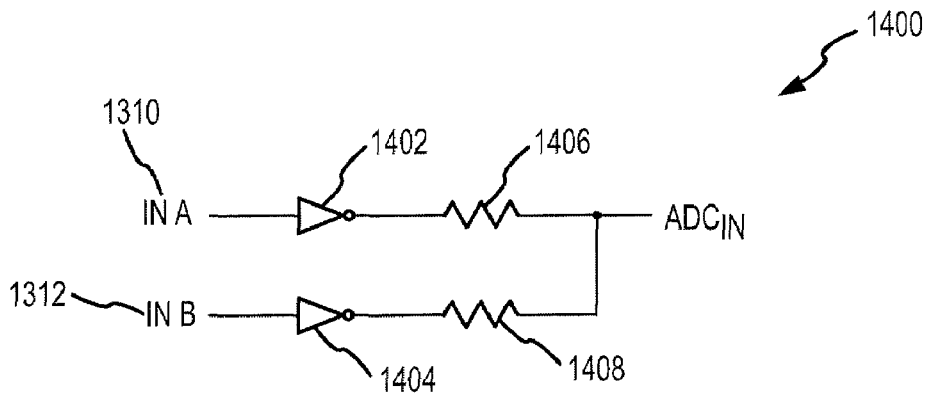

In accordance with one aspect, in some instances random discrete sources may be converted to binary discrete sources, as already discussed above. A three-state buffer circuit (which is innately non-linear because of its variable output impedance) may be converted to a linear binary discrete source, as depicted in FIGS. 11 and 12. In FIG. 11, circuit 1300 includes two inputs 1310 and 1312, a buffer 1302, and resistor 1304. As the voltage at ADCin will vary depending upon the levels produced by and the impedances of the other sources driving the ADCin, the ratios of the contributions of signal levels from the buffer will vary and in general will never be a fixed power of two, and the circuit will not be linear. The circuit may modified as shown in FIG. 12, where two buffers 1402 and 1404 are connected to inputs 1310 and 1312 and resistors 1406 and 1408. Such a circuit is linear. It is a binary discrete source if the ratio of resistances between resistors 1406 and 1408 is a power of two, and will be random discrete otherwise.

In summary, the present invention generally provides a way of using parallel-configured signal source/resistor pairs in a voltage divider network such that a single ADC input can be used to specify the state of more than one switch or other signal source. It will be appreciated that this solution uses approximately half the number of resistors that would be required in a comparable R2R ladder network. Furthermore, the switches of the current invention do not need to be connected to both a high and low voltage reference, as with R2R networks.

As described above, when combining multiple sources into an ADCin for conversion, it can be seen that certain rules apply. For example, all ADCin values should correspond to unique combinations of source values.

When combining multiple sources into an ADCin for conversion, it can also be seen that certain design principles are desirable. All sources should be linear, so that the portion of each source appearing at the ADCin is independent of the levels of all other sources. This simplifies the problem of determining the values of the sources contributing to a particular ADC conversion level. All or all but one of the sources should be binary discrete. Ideally, the contributions of all binary discrete sources to ADCin are scaled so that all possible values of ADCin are mapped exactly to actual ADC conversion levels. Scaling is also chosen so that the signal source contributions to ADCin are at the highest possible levels. This selection of scaling factors makes the most efficient use of available conversion levels and minimizes susceptibility to noise and ADC conversion error.

In certain cases, it will be desirable to include continuous or random discrete sources among those to be converted. At most, only one of either of these two can be included for reasons discussed earlier. Ideally, these sources are linear. When used, their contributions to ADCin should be scaled to ensure that their highest and lowest levels are contained within a range no greater than that spanned by the LSBs not allocated to the binary discrete sources. This will ensure uniqueness of ADCin levels.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A multiplexer circuit comprising:
   an output node;
   an analog-to-digital converter having an input coupled to said output node and an output coupled to a microprocessor;

a first resistor in series with a first signal source, said first resistor and said first signal source coupled to said output node, wherein said first signal source is configured to produce a first signal; and a second resistor in series with a second signal source, said second resistor and said second signal source coupled to said output node, wherein said second signal source is configured to produce a second signal;

wherein said first resistor and said second resistor have values selected such that an output voltage at said output node is unique for each combination of said first and second signals; and wherein the first signal source is a continuous signal source the output has a plurality of bits including a set of least significant bits (LSBs) and the LSBs are allocated to the first signal source.

2. The multiplexer circuit of claim 1, wherein the first signal source is a binary discrete signal source and the second signal source is a binary discrete signal source.

3. The multiplexer circuit of claim 1, wherein the first signal source is a binary discrete signal source.

4. The multiplexer circuit of claim 1, wherein the first signal is a random discrete signal source.

5. The multiplexer circuit of claim 1, wherein the first signal source is either a continuous signal source or a random discrete signal source, and wherein the second signal source is a binary discrete signal source.

6. A multiplexer circuit comprising:
an output node;
an analog-to-digital converter having an input coupled to said output node and an output coupled to a microprocessor;
a first resistor in series with a first signal source said first resistor and said first signal source coupled to said output node, wherein said first signal source is configured to produce a first signal;
a second resistor in series with a second signal source said second resistor and said second signal source coupled to said output node, wherein said second signal source is configured to produce a second signal; and
wherein said first resistor and said second resistor have values selected such that an output voltage at said output node is unique for each combination of said first and second signals, wherein the output has a plurality of bits including a set of least significant bits (LSBs), further wherein the plurality of bits includes assigned bits and unassigned bits, the assigned bits having least significant assigned bits, wherein the unassigned bits includes the LSBs and the assigned least significant bits are allocated to the first source.

7. A multiplexer circuit comprising:
an output node;
an analog-to-digital converter having an input coupled to the output node and an output coupled to a microprocessor, the analog-to-digital converter having a set of least significant bits (LSBs); and
a plurality of resistors in series with a plurality of associated signal sources coupled to the output node, wherein the signal sources are configured to produce a plurality of respective signals, and wherein the plurality of resistors have values selected such that an output voltage at the output node is unique for each combination the plurality of signals;
wherein each of the plurality of signal sources is selected from the group consisting of continuous sources, discrete binary sources, and random binary sources, such that the plurality of signal sources includes either a single continuous source or a single random discrete source or a single binary discrete source allocated to the LSBs, and the plurality of signal sources includes at least one binary discrete source.

8. The multiplexer circuit of claim 7, further including a inverting summer component having a negative input coupled to the plurality of resistors, a positive input coupled to a non-zero voltage value, an output coupled to the analog-to-digital converter, and a feedback resistor connected from the output to the negative input.

9. The multiplexer circuit of claim 7, wherein the discrete binary sources are selected from the group consisting of digital-to-analog converters and R-2R ladder networks.

10. The multiplexer circuit of claim 7, wherein the output has a plurality of bits including a set of least significant bits (LSBs), further wherein the plurality of bits includes assigned bits and unassigned bits, the assigned bits having assigned least significant bits, wherein the unassigned bits includes the LSBs and the assigned least significant bits are allocated to the first source.

11. The multiplexer circuit of claim 7, wherein the first signal source is either a continuous signal source or a random discrete signal source, and wherein the second signal source is a binary discrete signal source.

12. The multiplexer circuit of claim 7, wherein the plurality of signal sources are linearized.

13. The multiplexer circuit of claim 7, wherein the single continuous source is selected from the group consisting of microphones and photodetectors.

14. A multiplexer circuit comprising:
an output node;
an analog-to-digital converter having an input coupled to the output node and an output coupled to a microprocessor, the analog-to-digital converter; and
a plurality of resistors in series with a plurality of associated signal sources coupled to the output node, wherein the signal sources are configured to produce a plurality of respective signals, and wherein the plurality of resistors have values selected such that an output voltage at the output node is unique for each combination the plurality of signals;
wherein each of the plurality of signal sources is selected from the group consisting of continuous sources, discrete binary sources, and random binary sources, and wherein the output has a plurality of bits including a set of least significant bits (LSBs), further wherein the plurality of bits includes assigned bits and unassigned bits, the assigned bits having least significant assigned bits, wherein the unassigned bits includes the LSBs and the least significant assigned bits are allocated to the first source.

* * * * *